United States Patent
Li et al.

(10) Patent No.: US 10,658,618 B2
(45) Date of Patent: May 19, 2020

(54) DISPLAY DEVICE AND PACKAGING METHOD THEREOF, DISPLAY APPARATUS

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Zhiyong Li, Beijing (CN); Wei Hu, Beijing (CN); Hui Che Lin, Beijing (CN); Zhenmei Xie, Beijing (CN); Jia Liu, Beijing (CN); Dianxin Liu, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 60 days.

(21) Appl. No.: 15/997,929

(22) Filed: Jun. 5, 2018

(65) Prior Publication Data
US 2019/0103586 A1   Apr. 4, 2019

(30) Foreign Application Priority Data
Sep. 30, 2017   (CN) .......................... 2017 1 0928947

(51) Int. Cl.
*H01L 51/52*   (2006.01)
(52) U.S. Cl.
CPC ...... *H01L 51/5259* (2013.01); *H01L 51/5246* (2013.01); *H01L 51/5253* (2013.01)

(58) Field of Classification Search
CPC ............. H01L 51/5273; H01L 51/5259; H01L 51/5246; H01L 51/5256
See application file for complete search history.

(56) References Cited

U.S. PATENT DOCUMENTS 7,477,012 B2 * 1/2009 Su .................... H01L 51/5256
  313/504
8,044,583 B2 * 10/2011 Kim .................. H01L 51/5253
  313/507

(Continued)

FOREIGN PATENT DOCUMENTS

CN      1710998 A    12/2005
CN    106409873 A     2/2017

(Continued)

OTHER PUBLICATIONS

The First Chinese Office Action dated Sep. 13, 2018; Appln. No. 201710928947.2.

*Primary Examiner* — Ricardo Osorio

(57) ABSTRACT

Embodiments of the present disclosure provide a display device, a packaging method thereof and a display apparatus. The display device includes a base substrate; and a light-emitting unit and a packaging unit sequentially disposed on the base substrate, the packaging unit includes a first packaging film layer, a second packaging film layer and a water-absorbing functional layer located between the first packaging film layer and the second packaging film layer; the water-absorbing functional layer is mainly formed of a self-healing material with water absorbability.

8 Claims, 3 Drawing Sheets

(56) References Cited

U.S. PATENT DOCUMENTS

| | | | | |
|---|---|---|---|---|
| 8,080,587 B2* | 12/2011 | Suzuki | ............... | C09D 4/00 426/602 |
| 8,624,490 B2* | 1/2014 | Choi | ............... | H01L 51/5259 313/498 |
| 8,866,383 B2* | 10/2014 | Jang | ............... | H05B 33/10 313/512 |
| 9,000,666 B2* | 4/2015 | Ha | ............... | H01L 51/5237 313/512 |
| 9,065,072 B2* | 6/2015 | Song | ............... | H01L 51/5253 |
| 9,263,700 B2* | 2/2016 | Van Mol | ............... | H01L 51/5253 |
| 9,349,986 B2* | 5/2016 | Chen | ............... | H01L 51/5253 |
| 9,698,360 B2* | 7/2017 | Shi | ............... | H01L 51/56 |
| 9,825,254 B2* | 11/2017 | Wang | ............... | H01L 51/5256 |
| 10,418,590 B2* | 9/2019 | Tang | ............... | H01L 51/0097 |
| 2003/0117066 A1* | 6/2003 | Silvernail | ............... | H01L 51/5237 313/504 |
| 2005/0285521 A1 | 12/2005 | Menda | | |
| 2007/0207298 A1* | 9/2007 | Suzuki | ............... | G02B 1/118 428/216 |
| 2008/0272367 A1* | 11/2008 | Cok | ............... | H01L 51/5253 257/40 |
| 2010/0001634 A1* | 1/2010 | Fujita | ............... | H01L 51/5259 313/504 |
| 2010/0215929 A1* | 8/2010 | Seo | ............... | H01L 51/5237 428/213 |
| 2010/0265207 A1* | 10/2010 | Chen | ............... | G06F 3/0412 345/174 |
| 2011/0290551 A1* | 12/2011 | Lee | ............... | H01L 51/0096 174/520 |
| 2012/0289607 A1* | 11/2012 | Xiong | ............... | A61L 15/18 514/770 |
| 2012/0326194 A1* | 12/2012 | Son | ............... | H01L 51/5253 257/98 |
| 2013/0240848 A1* | 9/2013 | Lin | ............... | H01L 51/52 257/40 |
| 2013/0304004 A1* | 11/2013 | Riesinger | ............... | A61M 1/0001 604/319 |
| 2015/0102326 A1* | 4/2015 | An | ............... | H01L 51/5256 257/40 |
| 2015/0340655 A1* | 11/2015 | Lee | ............... | H01L 51/525 257/40 |
| 2016/0254489 A1* | 9/2016 | Sun | ............... | H01L 51/56 257/40 |
| 2017/0092897 A1 | 3/2017 | Liu | | |
| 2019/0086709 A1* | 3/2019 | Lee | ............... | G02F 1/133308 |

FOREIGN PATENT DOCUMENTS

| | | | |
|---|---|---|---|
| CN | 106887531 A | | 6/2017 |
| JP | 2004278264 A | * | 10/2004 |
| JP | 2013-051218 A | | 3/2013 |
| JP | 2014185715 A | * | 10/2014 |

* cited by examiner

DISPLAY DEVICE AND PACKAGING METHOD THEREOF, DISPLAY APPARATUS

The application claims priority of Chinese patent application No. 201710928947.2 filed with the SIPO on Sep. 30, 2017, the entire disclosure of which is incorporated herein by reference as part of the present application.

TECHNICAL FIELD

Embodiments of the present disclosure relate to a display device, a packaging method thereof and a display apparatus.

BACKGROUND

Organic light-emitting diode (OLED) displayer has been widely applied in various types of electronic apparatuses comprising electronic products such as computer and mobile phone, for its advantages such as self-luminous property, smaller weight and size, low power consumption, wider color gamut, and capability of achieving flexible display.

An OLED device in the OLED displayer is particularly sensitive to moisture and oxygen, and is very likely to be reacted with constituents in the air such as moisture and oxygen, which may cause a failure of the OLED device. As a result, for a packaging structure for OLED in the OLED displayer, it's very important to pay attention on isolation from moisture and oxygen. Especially, for a flexible displayer that is frequently bent during usage, it may easily cause a film layer in the packaging structure for OLED to be broken, and more easily result in an intrusion of moisture and oxygen, which reduces a service life of the OLED device.

SUMMARY

At least one embodiment of the present disclosure provides a display device, a packaging method thereof and a display apparatus, which can reduce a probability of moisture and oxygen intruding into the display device and improve a packaging effect of the display device.

Embodiments of the present disclosure, on one hand, provide a display device including a base substrate; and a light-emitting unit and a packaging unit sequentially disposed on the base substrate. The packaging unit includes a first packaging film layer, a second packaging film layer and a water-absorbing functional layer located between the first packaging film layer and the second packaging film layer, the water-absorbing functional layer is mainly formed of a self-healing material with water absorbability.

In an example, the self-healing material with water absorbability includes a composite material of konjac glucomannan and polyacrylamide (KGM/PAAm); or a composite material of konjac glucomannan, polyacrylamide and nano-clay.

In an example, both of the first packaging film layer and the second packaging film layer are an inorganic film layer; the packaging unit further includes an organic film layer located between the first packaging film layer and the second packaging film layer.

In an example, the water-absorbing functional layer is located between the first packaging film layer and the organic film layer, and is in contact with both of the first packaging film layer and the organic film layer, and the water-absorbing functional layer is located between the organic film layer and the second packaging film layer, and is in contact with both of the organic film layer and the second packaging film layer.

In an example, the water-absorbing functional layer is located between the first packaging film layer and the organic film layer, and is in contact with both of the first packaging film layer and the organic film layer, or the water-absorbing functional layer is located between the organic film layer and the second packaging film layer, and is in contact with both of the organic film layer and the second packaging film layer.

In an example, the organic film layer includes a first organic film layer and a second organic film layer, the water-absorbing functional layer is located between the first organic film layer and the second organic film layer, and is in contact with both of the first organic film layer and the second organic film layer.

In an example, the first packaging film layer is close to the light-emitting unit with respect to the second packaging film layer, the first packaging film layer is an inorganic film layer, and the second packaging film layer is an organic adhesive film.

In an example, the organic adhesive film includes a first organic adhesive film and a second organic adhesive film, the water-absorbing functional layer is located between the first organic adhesive film and the second organic adhesive film, and is in contact with both of the first organic adhesive film and the second organic adhesive film.

Embodiments of the present disclosure, on another hand, provide a display apparatus, including the above-mentioned display device.

Embodiments of the present disclosure, on yet another hand, provide a packaging method of a display device, including: forming a light-emitting unit on a base substrate; forming a first packaging film layer on the base substrate having been formed with the light-emitting unit; forming a water-absorbing functional layer mainly formed of a self-healing material with water absorbability on the base substrate having been formed with the first packaging film layer; and forming a second packaging film layer on the base substrate having been formed with the water-absorbing functional layer.

In an example, the forming a water-absorbing functional layer mainly formed of a self-healing material with water absorbability on the base substrate having been formed with the first packaging film layer includes: forming a water-absorbing functional layer mainly including a composite material of konjac glucomannan and polyacrylamide (KGM/PAAm) on the base substrate having been formed with the first packaging film layer; or forming a water-absorbing functional layer mainly including a composite material of konjac glucomannan, polyacrylamide and nano-clay on the base substrate having been formed with the first packaging film layer.

BRIEF DESCRIPTION OF THE DRAWINGS

Hereafter, in order to clearly describe technical solutions of the embodiments in the present disclosure in a better way, the drawings of the embodiments will be briefly introduced. Obviously, the drawings to be described below merely relate to some embodiments of the present disclosure without any limitation to the present disclosure.

DETAILED DESCRIPTION

Hereafter, the technical solutions in the embodiments of the present disclosure will be clearly, completely described with reference to the drawings in the embodiments of the present disclosure, so that objectives, technical solutions and advantageous of the embodiments of the present disclosure will be more apparent. Obviously, the embodiments described are only a part of the embodiments, not all embodiments. Based on the described embodiments in the present disclosure, all other embodiments obtained by one skilled in the art without paying inventive labor are within the protection scope of the present disclosure.

Unless otherwise defined, all the technical and scientific terms used herein have the same meanings as commonly understood by one of ordinary skill in the art to which the present invention belongs. The terms "first," "second," etc., which are used in the present disclosure, are not intended to indicate any sequence, amount or importance, but distinguish various devices. The phrases "comprise(s)" and "include(s)" etc., refer to that, an element or an object preceding this phrase encompasses element(s) or object(s) listed following this phrase, and equivalents thereof, without excluding the existence of other element(s) or object(s). "On," "under," "right," "left" and the like are only used to indicate relative position relationship, and when the position of the object which is described is changed, the relative position relationship may be changed accordingly.

Figure 1:
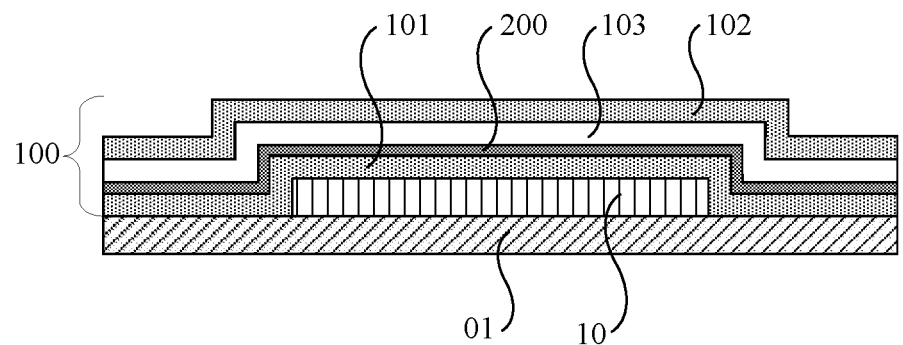
FIG. 1 is a structural view of a display device provided by an embodiment of the present disclosure.

An embodiment of the present disclosure provides a display device with a packaging structure. As illustrated in FIG. 1, the display device includes: a base substrate 01; and a light-emitting unit 10 and a packaging unit 100 sequentially disposed on the base substrate 01. Of course, generally, a side of the packaging unit 100 facing away from the base substrate 01 is further provided with a packaging substrate (not illustrated in FIG. 1). The light-emitting unit 10 can be an OLED, and can also be other light-emitting components. The base substrate 01 can be a rigid substrate, e.g., glass substrate, and can also be a flexible substrate. For example, the flexible substrate can include two polyimide (PI) layers and an inorganic layer located between the two PI layers; and the flexible substrate can also have other structures, without limited in the embodiment of the present disclosure.

As illustrated in FIG. 1, the packaging unit 100 includes a first packaging film layer 101, a second packaging film layer 102 and at least one water-absorbing functional layer 200 located between the first packaging film layer 101 and the second packaging film layer 102. The water-absorbing functional layer 200 is mainly formed of a self-healing material with water absorbability.

The display device with a packaging structure is provided with a water-absorbing functional layer inside the packaging unit and the water-absorbing functional layer is formed of a self-healing material with water absorbability. In this way, on one hand, with the water absorbing function, the water-absorbing functional layer can absorb moisture and hence block the moisture so as to reduce the probability of the moisture intruding into the display device; on the other hand, with the self-healing function, the water-absorbing functional layer can achieve a self-healing effect even when a damage is caused by external factors (e.g., a flexible displayer may be frequently bent during usage), so as to further reduce the probability of the moisture intruding into the display device.

Herein, it should be explained that, a self-healing process necessarily requires for an external promotion, e.g., absorbing water, heating, cooling and the like. In order to provide the water-absorbing functional layer with the self-healing function without additional requirements and in order to prevent from any negative influence to the display device caused by the self-healing process (e.g., a self-healing process at high temperature), in the embodiments of the present disclosure, a self-healing material with water absorbability is adopted to prepare the water-absorbing functional layer. By using the water-absorbing functional layer mainly formed of a self-healing material with water absorbability, on one hand the water absorbability can play a role of blocking moisture, and on the other hand the self-healing function allows a film layer to be self-healed and recovered even when the film layer is damaged and a crack is generated thereon, so as to prevent from any negative influence caused to the display device while satisfying both of the water absorbability and self-healing ability of the water-absorbing functional layer.

According to the embodiment of the present disclosure, the above-mentioned material that possesses water absorbability and can be self-healed under extreme condition can be any one or more selected from the group consisted of: a composite material of konjac glucomannan and polyacrylamide (KGM/PAAm); a composite material of konjac glucomannan, polyacrylamide and nano-clay; a composite material of polyacrylamide, sodium alginate and clay; and a composite material of chitosan and graphene oxide, without particularly limited in the embodiment of the present disclosure.

In some examples, considering the water absorbability, the self-healing ability and the stability of the material in the display device with packaging structure in practical application, the water-absorbing functional layer is formed of a composite material of konjac glucomannan and polyacrylamide (KGM/PAAm); or a composite material of konjac glucomannan, polyacrylamide and nano-clay.

Those skilled in the art should be appreciated that, the existing packaging structure for the display device includes a substrate packaging structure and a film packaging structure. The film packaging structure can be designed for use in a flexible display apparatus or a nonflexible display apparatus. Of course, considering a flexibility of a material of forming the flexible display apparatus and the fact that the flexible display apparatus is frequently bent during usage, the flexible display apparatus has much more strict requirement on a packaging effect of the packaging structure. On this basis, by adopting the packaging structure with self-healing function provided by the embodiment of the present disclosure, the flexible display apparatus can be more advantageous in preventing from an intrusion of moisture, as compared with the existing packaging structure.

Hereafter, the embodiments of the present disclosure will be described with reference to the case where the packaging structure for the display device comprising a water-absorbing functional layer formed of a composite material of konjac glucomannan and polyacrylamide (KGM/PAAm) is applied in substrate packaging and film packaging, respectively, by way of example.

In the case where the packaging structure for the display device in the embodiment of the present disclosure is a film packaging structure, for the packaging unit 100, both of the first packaging film layer 101 and the second packaging film layer 102 located at an outer layer are an inorganic film layer, and at least one organic film layer is disposed between these two inorganic film layers (i.e., the first packaging film layer 101 and the second packaging film layer 102). Of course, between the two inorganic film layers, it's also possible to dispose a structure in which multiple inorganic film layers and multiple organic film layers are alternately arranged, as long as the above-mentioned water-absorbing functional layer 200 is disposed at least between adjacent two film layers.

For example, the above-mentioned inorganic film layer can be formed of one or more selected from the group consisted of silicon nitride, silicon oxide, silicon oxynitride and aluminium oxide; the above-mentioned organic film layer can be formed of one or more selected from the group consisted of polyethylene terephthalate (PET), polyethylene naphthalate (PEN), polyimide (PI), polyvinyl chloride (PVC) and polytetrafluoroethylene (PTFE). Of course, the embodiment of the present disclosure is not limited thereto, and other materials can also be selected according to actual demands.

Hereafter a configuration of the water-absorbing functional layer 200 in the film packaging structure will be described in more details, by way of example.

For example, as illustrated in FIG. 1, the water-absorbing functional layer 200 can be located between the first packaging film layer 101 and the organic film layer 103, and is in contact with both of the first packaging film layer 101 and the organic film layer 103.

Figure 2:
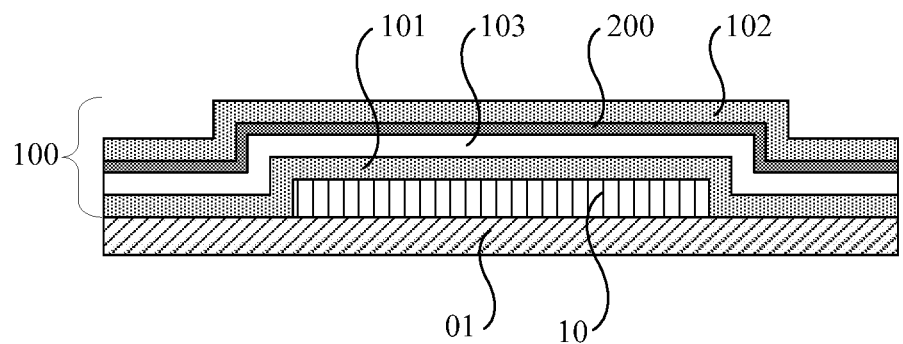
FIG. 2 is a structural view of another display device provided by an embodiment of the present disclosure.

For another example, as illustrated in FIG. 2, the water-absorbing functional layer 200 can also be located between the organic film layer 103 and the second packaging film layer 102, and is in contact with both of the organic film layer 103 and the second packaging film layer 102.

Figure 3:
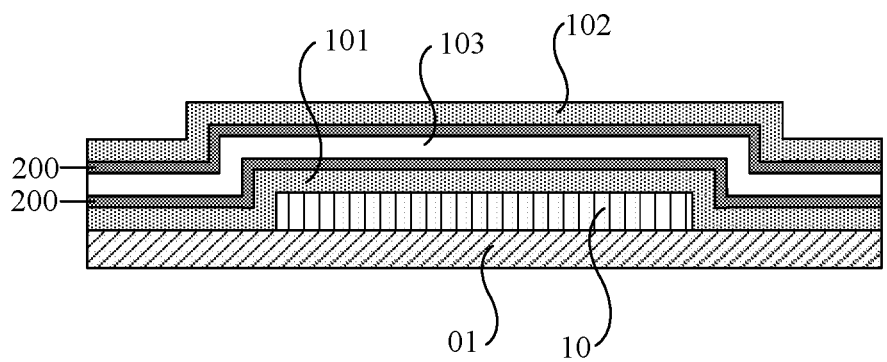
FIG. 3 is a structural view of yet another display device provided by an embodiment of the present disclosure.

For yet another example, the packaging unit 100 can be provided with a plurality of water-absorbing functional layers 200. For example, as illustrated in FIG. 3, the packaging unit 100 is provided with two water-absorbing functional layers 200. One of the two water-absorbing functional layers 200 is located between the first packaging film layer 101 and the organic film layer 103, and is in contact with both of the first packaging film layer 101 and the organic film layer 103; and the other one of the two water-absorbing functional layers 200 is located between the organic film layer 103 and the second packaging film layer 102, and is in contact with both of the organic film layer 103 and the second packaging film layer 102.

In the examples above, the water-absorbing functional layer 200 that is mainly formed of a composite material of konjac glucomannan and polyacrylamide (KGM/PAAm), as an organic layer, can achieve an obviously better affect when adhered with an organic layer, as compared with the case where it's adhered with an inorganic layer. As a result, for a design solution illustrated in FIGS. 1-3 in which one side of the water-absorbing functional layer 200 is provided with an organic layer (i.e., the organic film layer 103) and the other side of the water-absorbing functional layer 200 is provided with an inorganic layer (i.e., the first packaging film layer 101 or the second packaging film layer 102), it's likely occurred that the side of the water-absorbing functional layer 200 in contact with the first packaging film layer 101 or the second packaging film layer 102 may be separated due to relatively weaker adhesion when absorbing water.

Figure 4:
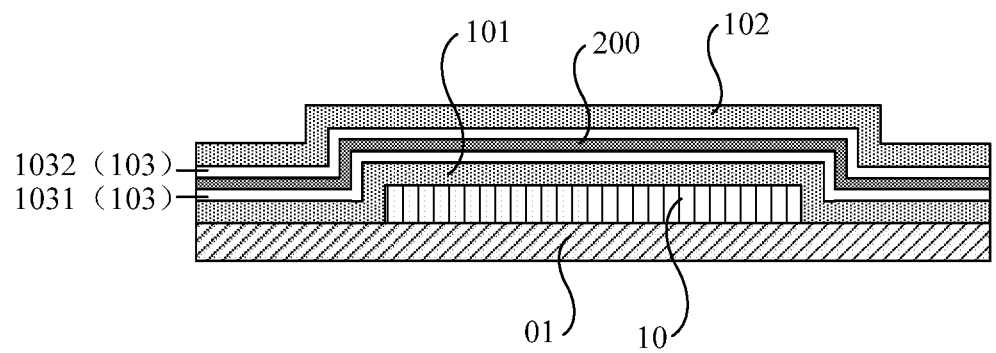
FIG. 4 is a structural view of further another display device provided by an embodiment of the present disclosure.

In order to solve the problem above, in some examples, the packaging unit 100 is provided with at least two organic film layers 103, and both sides of the water-absorbing functional layer 200 are in contact with the organic film layer 103. For example, as illustrated in FIG. 4, the organic film layer 103 in the packaging unit 100 includes a first organic film layer 1031 and a second organic film layer 1032; the water-absorbing functional layer 200 is located between the first organic film layer 1031 and the second organic film layer 1032, and is in contact with both of the first organic film layer 1031 and the second organic film layer 1032. In this way, both sides of the water-absorbing functional layer 200 are provided with an organic layer, so that a relatively stronger adhesion can be generated between the water-absorbing functional layer 200 and every adjacent layer thereof (the first organic film layer 1031 and the second organic film layer 1032), which prevent the water-absorbing functional layer 200 from separating when absorbing water.

Of course. FIG. 4 merely illustrates the case where the water-absorbing functional layer 200 is disposed between the first organic film layer 1031 and the second organic film layer 1032; and the water-absorbing functional layer 200 can also be disposed between the first packaging film layer 101 and the first organic film layer 1031, or between the second organic film layer 1032 and the second packaging film layer 102, without particularly limited in the embodiment of the present disclosure.

Figure 5:
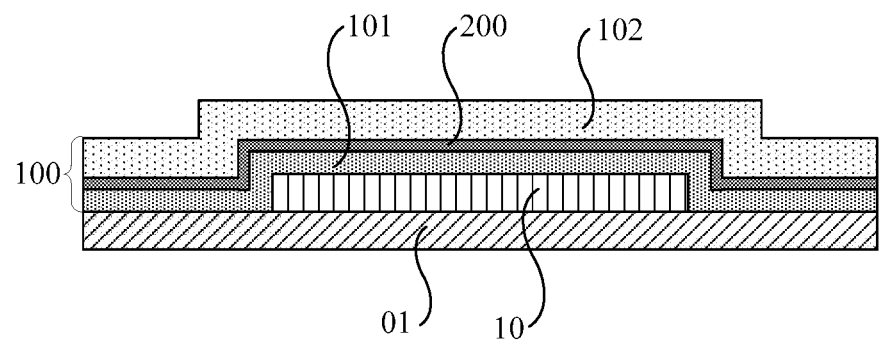
FIG. 5 is a structural view of further another display device provided by an embodiment of the present disclosure.

In the case where the packaging structure for the display device in the embodiment of the present disclosure is a substrate packaging structure, for the packaging unit 100, as illustrated in FIG. 5, the first packaging film layer 101 is an inorganic film layer, the second packaging film layer 102 is an organic adhesive film; the first packaging film layer 101 is close to the light-emitting unit 10 with respect to the second packaging film layer 102; the water-absorbing functional layer 200 is located between the first packaging film layer 101 and the second packaging film layer 102, that is, one side of the water-absorbing functional layer 200 is in contact with an inorganic film layer, and the other side of the water-absorbing functional layer 200 is in contact with an organic adhesive film.

For example, the above-mentioned organic adhesive film can adopt a thermoset phenolic resin material. Of course, the organic adhesive film can also adopt other organic adhesive material, without particularly limited in the embodiment of the present disclosure.

In the examples above, the water-absorbing functional layer 200, as an organic layer, can achieve an obviously better affect when adhered with an organic layer, as compared with the case where it's adhered with an inorganic layer. As a result, for a design solution illustrated in FIG. 5 in which one side of the water-absorbing functional layer 200 is in contact with an inorganic film layer (i.e., the first packaging film layer 101) and the other side of the water-absorbing functional layer 200 is in contact with an organic adhesive film (i.e., the second packaging film layer 102), it's likely occurred that the side of the water-absorbing functional layer 200 in contact with the first packaging film layer 101 may be separated due to relatively weaker adhesion when absorbing water.

In order to solve the problem above, in some examples, the packaging unit 100 is provided with at least two organic adhesive films, the water-absorbing functional layer 200 is located between two organic adhesive films and is in contact with both of the two organic adhesive films. Of course, the one among the at least two organic adhesive films that is farthest from the light-emitting unit 10 is just the above-mentioned second packaging film layer 102.

Figure 6:
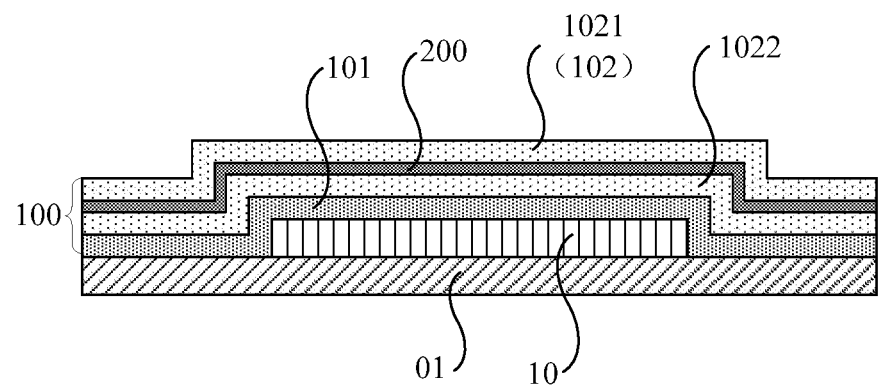
FIG. 6 is a structural view of further another display device provided by an embodiment of the present disclosure.

For example, as illustrated in FIG. 6, the packaging unit 100 can be provided with two organic adhesive films which are a first organic adhesive film 1021 and a second organic adhesive film 1022, respectively. The one of the two organic adhesive films that is farthest from the light-emitting unit 10 is just the above-mentioned second packaging film layer 102. The water-absorbing functional layer 200 is located between the first organic adhesive film 1021 and the second organic adhesive film 1022, and is in contact with both of the first organic adhesive film 1021 and the second organic adhesive film 1022. In this way, both sides of the water-absorbing functional layer 200 are provided with an organic layer, so that a relatively stronger adhesion can be generated between the water-absorbing functional layer 200 and every adjacent layer thereof, which prevent the water-absorbing functional layer 200 from separating when absorbing water.

The embodiment of the present disclosure further provides a display apparatus including the above-mentioned display device, and the display apparatus correspondingly can obtain the same technical effect with that of the display device, without repeating herein.

It should be explained that, in the embodiment of the present disclosure, the display apparatus at least can include an OLED display panel. For example, the OLED display panel can be applied in any product or device with display function such as displayer, television, digital photo frame, mobile phone and tablet computer.

Figure 7:
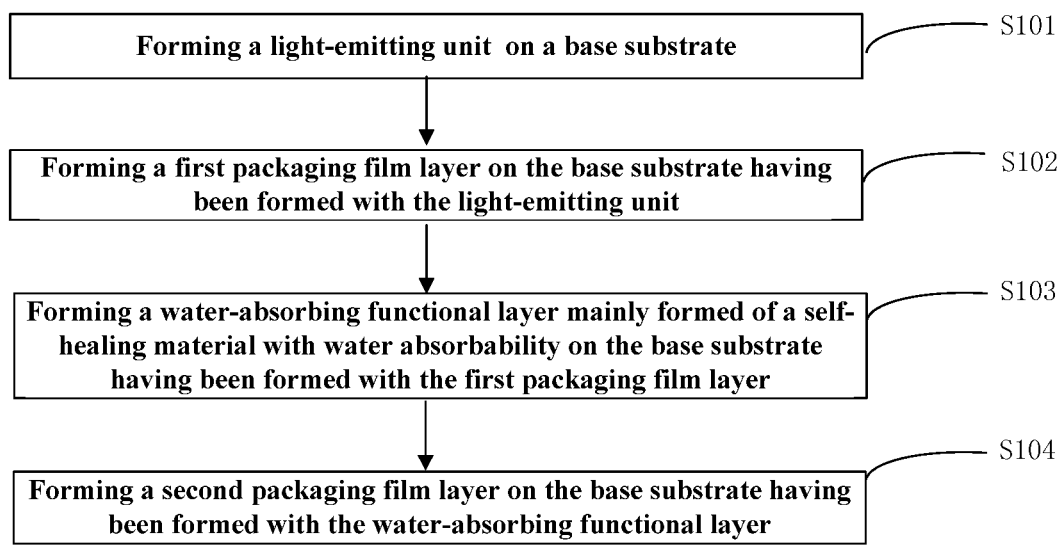
FIG. 7 is a flow chart of a packaging method of a display device provided by an embodiment of the present disclosure.

The embodiment of the present disclosure further provides a packaging method of a display device. As illustrated in FIG. 7, the packaging method includes steps as below.

Step S101, forming a light-emitting unit 10 on a base substrate 01.

In practical application, generally, the base substrate 01 includes not only a pure substrate but also is provided with at least a thin film transistor array (TFT Array).

For example, the light-emitting unit 10 can be an OLED including a cathode, an anode and a functional layer located between the cathode and the anode.

Step S102, forming a first packaging film layer 101 on the base substrate 01 having been formed with the light-emitting unit 10.

For example, the first packaging film layer 101 usually is an inorganic film layer.

Step S103, forming a water-absorbing functional layer 200 mainly formed of a self-healing material with water absorbability on the base substrate 01 having been formed with the first packaging film layer 101.

Step S104, forming a second packaging film layer 102 on the base substrate 01 having been formed with the water-absorbing functional layer 200.

Of course, the first packaging film layer 101, the second packaging film layer 102, and one or more film layer between the first packaging film layer 101 and the second packaging film layer 102, together, constitute the packaging unit 100 of the display device. According to actual demands, the above-mentioned packaging method can further include step(s) of forming other film layer(s), e.g., inorganic film layer(s), apart from the step S103, between the step S102 of forming the first packaging film layer 101 and the step S104 of forming the second packaging film layer 102. As for specific film layer structures and particular materials of respective film layer structures, reference may be made to the related description in the packaging structure described above, and appropriate processes and methods can be adopted correspondingly, without repeating in the embodiment of the present disclosure.

To sum up, in the packaging method provided by the embodiment of the present disclosure, a water-absorbing functional layer formed of a self-healing material with water absorbability is disposed inside the packaging unit. In this way, on one hand, with the water absorbing function, the water-absorbing functional layer can absorb moisture and hence block the moisture so as to reduce the probability of the moisture intruding into the display device; on the other hand, with the self-healing function, the water-absorbing functional layer can achieve self-healing effect even when a damage is caused by external factors (e.g., a flexible dis-player may be frequently bent during usage), so as to further reduce the probability of the moisture intruding into the display device.

In some examples, for the step S103, forming a water-absorbing functional layer 200 mainly formed of a self-healing material with water absorbability on the base substrate 01 having been formed with the first packaging film layer 101 can include:

forming a water-absorbing functional layer 200 mainly including a composite material of konjac glucomannan and polyacrylamide (KGM/PAAm) on the base substrate 01 having been formed with the first packaging film layer 101; or forming a water-absorbing functional layer 200 mainly including a composite material of konjac glucomannan, polyacrylamide and nano-clay on the base substrate 01 having been formed with the first packaging film layer 101.

For example, a solution mainly including a composite material of konjac glucomannan and polyacrylamide (KGM/PAAm) or a solution mainly including a composite material of konjac glucomannan, polyacrylamide and nano-clay can be coated (printed) onto the base substrate 01 having been formed with the first packaging film layer 101, and then is solidified and desolventized, so as to obtain the above-mentioned water-absorbing functional layer 200 which possesses water absorbability and self-healing capability. The process of solidification and desolventization can be achieved by heating at high temperature, and meanwhile preventing an excessively high temperature from negatively affecting the display device.

Hereafter, an illustrative method of preparing a solution of a composite material of konjac glucomannan and polyacrylamide (KGM/PAAm) used in preparing the water-absorbing functional layer 200 is described by way of example.

First of all, dissolving 20-35 g of acrylamide monomer, 15-20 mg of N,N'-methylene bisacrylamide (MBAA) as a cross-linking agent and 25-35 mg of KPS as an initiator in 90-100 mL of deionized water to form a solution; then purging oxygen with nitrogen from the solution for 4-5 min; then adding 4-6 mL of ammonia water (20%-30%) into the solution; then adding 3-4.5 g of konjac glucomannan (KGM) powders into the solution slowly while mixing the solution, so as to obtain a solution of a composite material of konjac glucomannan and polyacrylamide (KGM/PAAm).

Subsequently, coating (printing) the solution of the composite material of konjac glucomannan and polyacrylamide (KGM/PAAm) as obtained onto a substrate; then placing the substrate into a sealed container; pumping oxygen gas from the container and filling the container with high purity nitrogen as a replacement; finally, rising a temperature in the reaction container to 50° C.-70° C. to cause a reaction of the solution for 10-30 min so as to obtain a composite material of konjac glucomannan and polyacrylamide (KGM/PAAm), which is then baked suitably to obtain a KGM/PAAm thin film (i.e., the water-absorbing functional layer 200).

Herein, it should be explained that, in order to ensure the water-absorbing functional layer 200 having better self-healing capability, in practical application, when adding the 4-6 mL of ammonia water (20%-30%) into the solution, 0.03-0.07 mol/L of nano-clay (with a diameter of 10-50 nm) can be additionally added so as to form a water-absorbing functional layer 200 of a composite material of konjac glucomannan, polyacrylamide and nano-clay.

Of course, in the above-mentioned method of preparing the solution of a composite material of konjac glucomannan and polyacrylamide (KGM/PAAm) or preparing the solution of a composite material of konjac glucomannan, polyacrylamide and nano-clay, the amounts of constituents are provided by way of example only. In practical application, the respective amounts can be increased based on the ratio of the constituents described above.

In addition, by performance tests, it has been demonstrated that, the film (i.e., the water-absorbing functional layer) of the composite material of konjac glucomannan, polyacrylamide and nano-clay prepared by using the above-mentioned method provided by the present disclosure, upon absorbing water, has increased flexibility and is capable of restoring a micro-crack generated during folding by its self-healing capability, with a self-healing efficiency of 71% under an ambient temperature condition.

At the same time, it's tested that the above-mentioned film has parameters as below: a swelling degree of 9, i.e., the film reaching a swelling equilibrium has a water content as much as 90%, which means an excellent water absorbability; a transmission coefficient for vapor of 0.9 g·mm/m2d·kPa; a moisture rate of 15% under RH60% and a moisture rate of 70% under RH100%; an oxygen permeability of 9 meq/kg.

Based on the data above, it can be seen that, using the film mainly formed of the composite material of konjac glucomannan and polyacrylamide (KGM/PAAm) as the water-absorbing functional layer can reduce the probability of the moisture intruding into the display device; furthermore, the konjac glucomannan has mass production in China and hence is cheap in price, which facilitates reducing the cost.

The following statements should be noted:

(1) Unless otherwise defined, in the embodiment(s) and accompanying drawings of the present disclosure, the same reference numeral indicates the same meaning.

(2) The accompanying drawings of the embodiment(s) of the present disclosure involve only the structure(s) in connection with the embodiment(s) of the present disclosure, and other structure(s) can be referred to common design(s).

(3) For the purpose of clarity, in the accompanying drawings for illustrating the embodiment(s) of the present disclosure, a layer or an area may be enlarged. It should be understood that, in the case in which a device such as a layer, film, area, substrate or the like is referred to be "on" or "under" another device, it may be directly on or under the another device or yet another device is interposed therebetween.

The foregoing are merely embodiments of the invention, but not limitative to the protection scope of the invention. Within the technical scope disclosed by the present disclosure, any alternations or replacements which can be readily envisaged by one skilled in the art shall be within the protection scope of the present disclosure. Therefore, the protection scope of the invention shall be defined by the accompanying claims.

What is claimed is:

1. A display device, comprising a base substrate; and a light-emitting unit and a packaging unit sequentially disposed on the base substrate;

the packaging unit comprising a first packaging film layer, a second packaging film layer as well as a plurality of water-absorbing functional layers and an organic film layer located between the first packaging film layer and the second packaging film layer, the water-absorbing functional layers at least comprising a first water-absorbing functional layer and a second water-absorbing functional layer;

the water-absorbing functional layer being mainly formed of a self-healing material with water absorbability, wherein both of the first packaging film layer and the second packaging film layer are inorganic film layers;

the water-absorbing functional layer is arranged between every adjacent film layers in the packaging unit, the first water-absorbing functional layer is in direct contact with both of the first packaging film layer and the organic film layer, and the second water-absorbing functional layer is in direct contact with both of the second packaging film layer and the organic film layer, and wherein the self-healing material with water absorbability of the water-absorbing functional layer comprises a composite material of konjac glucomannan, polyacrylamide and nano-clay.

2. The display device according to claim 1, wherein the organic film layer comprises a first organic film layer and a second organic film layer, the water-absorbing functional layers further comprise a third water-absorbing functional layer, the third water-absorbing functional layer is located between the first organic film layer and the second organic film layer, and is in contact with both of the first organic film layer and the second organic film layer.

3. The display device according to claim 1, wherein the first packaging film layer is close to the light-emitting unit with respect to the second packaging film layer.

4. A display apparatus, comprising a display device, the display device comprising: a base substrate; and a light-emitting unit and a packaging unit sequentially disposed on the base substrate;

the packaging unit comprising a first packaging film layer, a second packaging film layer as well as a plurality of water-absorbing functional layers and an organic film layer located between the first packaging film layer and the second packaging film layer, the water-absorbing functional layers at least comprising a first water-absorbing functional layer and a second water-absorbing functional layer;

the water-absorbing functional layer being mainly formed of a self-healing material with water absorbability, wherein both of the first packaging film layer and the second packaging film layer are inorganic film layers;

the water-absorbing functional layer is arranged between every adjacent film layers in the packaging unit, the first water-absorbing functional layer is in direct contact with both of the first packaging film layer and the organic film layer, and the second water-absorbing functional layer is in direct contact with both of the second packaging film layer and the organic film layer, and wherein the self-healing material with water absorbability of the water-absorbing functional layer comprises a composite material of konjac glucomannan, polyacrylamide and nano-clay.

5. The display apparatus according to claim 4, wherein the organic film layer comprises a first organic film layer and a second organic film layer,
the water-absorbing functional layers further comprise a third water-absorbing functional layer, the third water-absorbing functional layer is located between the first organic film layer and the second organic film layer, and is in contact with both of the first organic film layer and the second organic film layer.

6. The display apparatus according to claim 4, wherein the first packaging film layer is close to the light-emitting unit with respect to the second packaging film layer.

7. A packaging method of a display device, comprising:
forming a light-emitting unit on a base substrate;
forming a first packaging film layer on the base substrate having been formed with the light-emitting unit;
forming a plurality of water-absorbing functional layers mainly formed of a self-healing material with water absorbability and forming an organic film layer, on the base substrate having been formed with the first packaging film layer, the water-absorbing functional layers at least comprising a first water-absorbing functional layer and a second water-absorbing functional layer; and
forming a second packaging film layer on the base substrate having been formed with the water-absorbing functional layer, wherein
both of the first packaging film layer and the second packaging film layer are inorganic film layers;
the water-absorbing functional layer is arranged between every adjacent film layers in the packaging unit, the first water-absorbing functional layer is in direct contact with both of the first packaging film layer and the organic film layer, and the second water-absorbing functional layer is in direct contact with both of the second packaging film layer and the organic film layer, and wherein
the self-healing material with water absorbability of the water-absorbing functional layer comprises a composite material of konjac glucomannan, polyacrylamide and nano-clay.

8. The packaging method according to claim 7, wherein
forming the plurality of water-absorbing functional layers further comprises forming a third water-absorbing functional layer,
forming the organic film layer further comprises forming a first organic film layer and a second organic film layer, and wherein
the third water-absorbing functional layer is located between the first organic film layer and the second organic film layer, and is in contact with both of the first organic film layer and the second organic film layer.

* * * * *